United States Patent
Motz et al.

(10) Patent No.: US 7,952,350 B2
(45) Date of Patent: May 31, 2011

(54) CIRCUIT THAT PROVIDES OUTPUT VOLTAGES IN A HOMOGENOUS MAGNETIC FIELD

(75) Inventors: Mario Motz, Wernberg (AT); Tobias Werth, Villach (AT); Valentin Aldea, Bucuresti (RO); Razvan-Catalin Mialtu, Pitesti (RO); Stefan Dineci, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 541 days.

(21) Appl. No.: 12/130,230

(22) Filed: May 30, 2008

(65) Prior Publication Data
US 2009/0295380 A1    Dec. 3, 2009

(51) Int. Cl.
*G01R 33/06* (2006.01)
(52) U.S. Cl. .................. 324/251; 324/207.2; 327/511

(58) Field of Classification Search .................. 324/251, 324/207.2; 327/511
See application file for complete search history.

(56) References Cited

U.S. PATENT DOCUMENTS 4,135,120 A * 1/1979 Hoshimi et al. ........... 318/400.4
5,844,427 A * 12/1998 Theus et al. .................. 327/51

* cited by examiner

*Primary Examiner* — Reena Aurora
(74) *Attorney, Agent, or Firm* — Dicke, Billig & Czaja, P.L.L.C.

(57) ABSTRACT

A circuit including Hall plates and an amplifier. The Hall plates are configured to provide Hall voltages in a homogenous magnetic field such that a first Hall plate has a first positive voltage and a first negative voltage and a second Hall plate has a second positive voltage and a second negative voltage. The amplifier is configured to receive the Hall voltages and provide a first output voltage that corresponds to the first positive voltage and the second positive voltage and a second output voltage that corresponds to the first negative voltage and the second negative voltage.

25 Claims, 7 Drawing Sheets

CIRCUIT THAT PROVIDES OUTPUT VOLTAGES IN A HOMOGENOUS MAGNETIC FIELD

BACKGROUND

Hall effect sensors are based on the Hall effect, which was named after its discoverer Edwin Hall in 1879. Typically, a constant current is provided to a Hall element or plate and a magnetic field is applied perpendicular to the current flowing through the Hall plate. Charge carriers in the Hall plate are deflected due to the Lorentz force to create a Hall voltage that is perpendicular to both the magnetic field and the current flow. This Hall voltage can be measured and is directly proportional to the magnetic field. Hall effect sensors are used for speed, rotational speed, linear position, linear angle and position measurements in automotive, industrial and consumer applications. Usually, Hall sensor integrated circuit chips include one or more Hall plates and signal conditioning circuitry, such as an amplifier.

Typically, a differential Hall effect sensor includes two Hall plates and a differential amplifier. The Hall plates are coupled to the differential amplifier and provide Hall voltages to the differential amplifier, such that the difference between magnetic field fluxes at the Hall plates is detected and amplified to provide an output signal. Differential Hall effect sensors can be used to detect the motion and position of ferromagnetic and permanent magnet structures. To detect ferromagnetic objects, such as a toothed ferromagnetic wheel, the magnetic field is provided via a back biasing permanent magnet.

Testing a differential Hall effect sensor includes applying a differential magnetic field to the sensor, such that the two Hall plates receive different or in best case opposing magnetic field fluxes. However, it's difficult to generate a differential magnetic field over small Hall plate distances at the surface of a sensor via a coil and magnetic core system. Mechanical positioning tolerances between the sensor and the magnetic core are tight and inaccurately positioning the sensor in the differential magnetic field leads to measurement errors that reduce product yields. Close contact between a sensor and the magnetic core produces large differential magnetic fields at the surface of the sensor and keeps mechanical positioning errors small. However, close contact between the sensor and the magnetic core leads to abrasion of the magnetic core over time and unstable measurements. Also, inaccurately positioning a sensor in a package contributes to measurement errors.

For these and other reasons there is a need for the present invention.

SUMMARY

One embodiment described in the disclosure provides a circuit including Hall plates and an amplifier. The Hall plates are configured to provide Hall voltages in a homogenous magnetic field such that a first Hall plate has a first positive voltage and a first negative voltage and a second Hall plate has a second positive voltage and a second negative voltage. The amplifier is configured to receive the Hall voltages and provide a first output voltage that corresponds to the first positive voltage and the second positive voltage and a second output voltage that corresponds to the first negative voltage and the second negative voltage.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
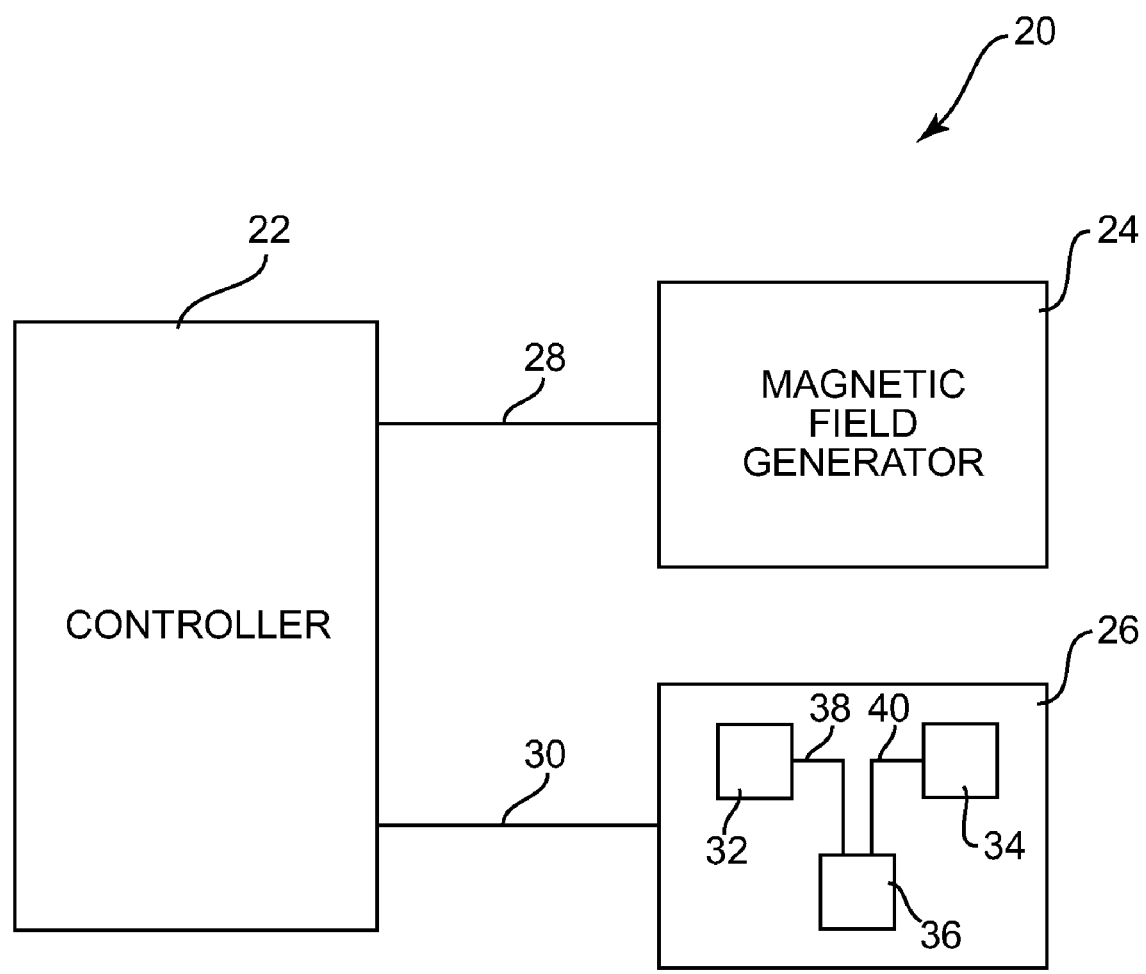
FIG. 1 is a diagram illustrating one embodiment of a system that can test one or more differential Hall effect sensors.

FIG. 1 is a diagram illustrating one embodiment of a system 20 that can test one or more differential Hall effect sensors. System 20 includes a controller 22, a magnetic field generator 24 and a device under test (DUT) that is a differential Hall effect sensor, referred to herein as Hall sensor 26. Controller 22 is electrically coupled to magnetic field generator 24 via control communications path 28 and to Hall sensor 26 via DUT communications path 30. In one embodiment, system 20 is a test system for testing any suitable number of differential Hall effect sensors similar to Hall sensor 26. In one embodiment, controller 22 is a tester.

Hall sensor 26 includes a first Hall element or plate 32, a second Hall element or plate 34 and an amplifier 36. First Hall plate 32 is electrically coupled to amplifier 36 via first Hall plate input path 38, and second Hall plate 34 is electrically coupled to amplifier 36 via second Hall plate input path 40. Each of the first and second Hall plates 32 and 34 includes one side referred to as a positive voltage side and another side referred to as a negative voltage side. In a magnetic field, first Hall plate 32 provides a first Hall voltage via a positive voltage on one side and a negative voltage on the other side, and second Hall plate 32 provides a second Hall voltage via a positive voltage on one side and a negative voltage on the other side. First Hall plate 32 provides the first Hall voltage to amplifier 36 via first Hall plate input path 38 and second Hall plate 34 provides the second Hall voltage to amplifier 36 via second Hall plate input path 40. First and second Hall plates 32 and 34 are situated in the same homogeneous magnetic field or in different magnetic field fluxes of a differential magnetic field to provide Hall voltages.

Controller 22 controls magnetic field generator 24 via control communications path 28 to provide magnetic fields including a homogeneous magnetic field, where first Hall plate 32 and second Hall plate 34 are situated in the same homogeneous magnetic field generated via magnetic field generator 24. In one embodiment, controller 22 also controls magnetic field generator 24 to provide a differential magnetic field, where first Hall plate 32 is situated in a first magnetic field flux of the differential magnetic field and second Hall plate 34 is situated in a second magnetic field flux of the differential magnetic field that is substantially the opposite of the first magnetic field flux.

Amplifier 36 receives the Hall voltages from first Hall plate 32 and second Hall plate 34 and provides output voltages that correspond to the received Hall voltages. Controller 22 sets amplifier 36 to operate in a normal mode or a test mode, also referred to as an inverted mode, via DUT communications path 30. In normal mode, amplifier 36 receives the Hall voltages from first Hall plate 32 and second Hall plate 34 and provides a first output voltage that corresponds to a summation of voltages on one of the positive voltage sides and one of the negative voltage sides and a second output voltage that corresponds to a summation of voltages on the other one of the positive voltage sides and on the other one of the negative voltage sides of the Hall plates. In test mode, amplifier 36 receives the Hall voltages from first Hall plate 32 and second Hall plate 34 and provides a first output voltage that corresponds to a summation of voltages on the positive voltage sides and a second output voltage that corresponds to a summation of the voltages on the negative voltage sides.

In normal mode operation, controller 22 controls magnetic field generator 24 to provide a differential magnetic field, where first Hall plate 32 is situated in a first magnetic field flux of the differential magnetic field and second Hall plate 34 is situated in a second magnetic field flux of the differential magnetic field. Amplifier 36 receives the Hall voltages from first Hall plate 32 and second Hall plate 34 and provides a first output voltage that corresponds to a summation of voltages on one of the positive voltage sides and one of the negative voltage sides and a second output voltage that corresponds to a summation of voltages on the other one of the positive voltage sides and on the other one of the negative voltage sides of the Hall plates.

In test mode operation, controller 22 controls magnetic field generator 24 to provide a homogeneous magnetic field, where first Hall plate 32 and second Hall plate 34 are situated in the same homogeneous magnetic field generated via magnetic field generator 24. Amplifier 36 receives the Hall voltages from first Hall plate 32 and second Hall plate 34 and provides a first output voltage that corresponds to a summation of voltages on the positive voltage sides and a second output voltage that corresponds to a summation of the voltages on the negative voltage sides.

Differential Hall effect sensors, such as Hall sensor 26, are tested in a homogeneous magnetic field, instead of a differential magnetic field. The homogeneous magnetic field is easier to produce than the differential magnetic field and mechanical positioning tolerances are not as tight, which decreases measurement errors and increases product yields. Also, Hall sensor 26 does not have to be in close contact with the magnetic field generator 24, which reduces degradation of the magnetic field generator 24 and promotes stable measurements.

Figure 2:
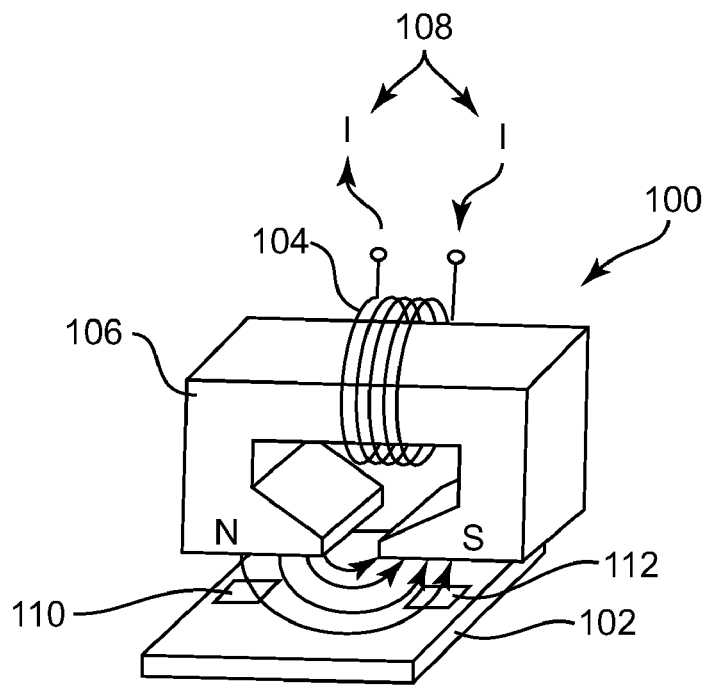
FIG. 2 is a diagram illustrating one embodiment of a differential magnetic field generator and a differential Hall effect sensor.

FIG. 2 is a diagram illustrating one embodiment of a magnetic field generator 100 and a differential Hall effect sensor, referred to as Hall sensor 102. Magnetic field generator 100 is similar to magnetic field generator 24 and Hall sensor 102 is similar to Hall sensor 26.

Magnetic field generator 100 includes a coil 104 and a core 106. Current I at 108 is passed through coil 104 and the magnetic field about each turn of wire links with the magnetic fields of adjacent turns to produce a two-pole magnetic field, similar to that of a simple bar magnet. Core 106 receives the two-pole magnetic field such that one end of core 106 is a north pole N and the other end is a south pole S. The resulting magnetic field extends from the north pole N to the south pole S. In one embodiment, core 106 is an iron core and magnetic field generator 100 is an iron-core electromagnet.

Hall sensor 102 includes a first Hall plate 110, a second Hall plate 112 and an amplifier (not shown). First Hall plate 110 is situated in the magnetic field lines of flux that extend from the north pole N toward the bottom of Hall sensor 102 and second Hall plate 112 is situated in the magnetic field lines of flux that extend in the opposite direction, from the bottom of Hall sensor 102 to the south pole S. Hall sensor 102 can be situated in this differential magnetic field in normal mode or in test mode.

In operation, controller 22 controls magnetic field generator 100 to provide the differential magnetic field. First Hall plate 110 is situated in the magnetic field flux that extends from the north pole N toward the bottom of Hall sensor 102 and second Hall plate 112 is situated in the opposing magnetic field flux. Measurements can be taken from Hall sensor 102 in normal mode and/or inverted mode in the differential magnetic field.

Figure 3:
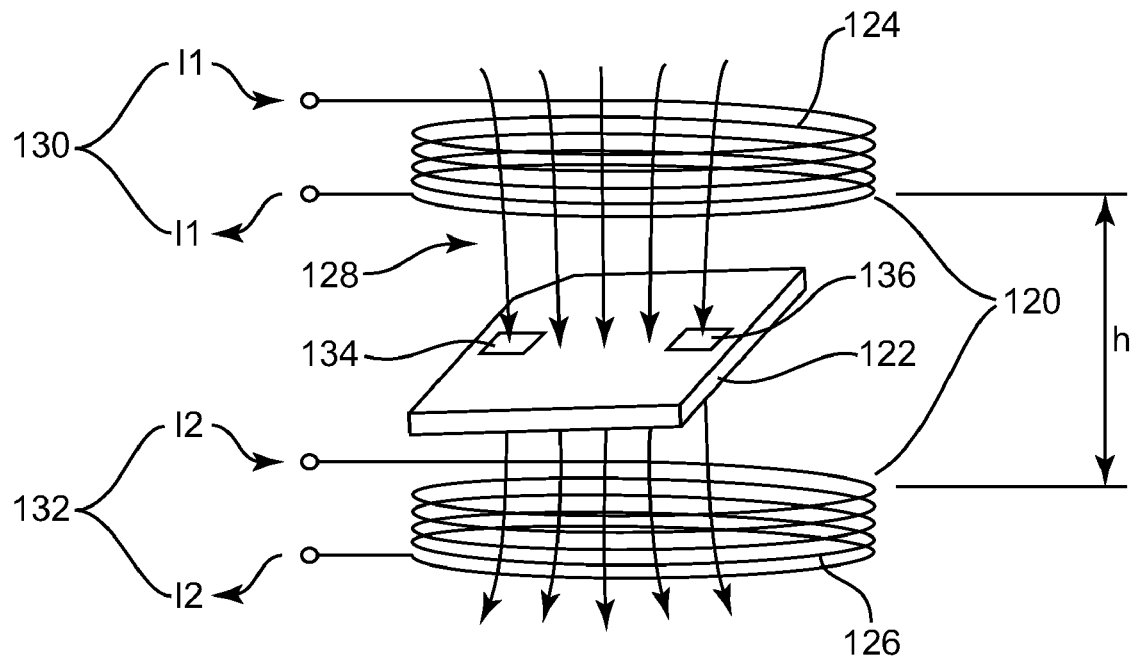
FIG. 3 is a diagram illustrating one embodiment of a homogenous magnetic field generator that includes a Helmholtz pair of coils, and a differential Hall effect sensor.

FIG. 3 is a diagram illustrating one embodiment of a homogeneous magnetic field generator 120 and a differential Hall effect sensor, referred to as Hall sensor 122. Magnetic field generator 120 includes a Helmholtz pair of coils 124 and 126 that produce a region of nearly uniform magnetic field 128. Magnetic field generator 120 is similar to magnetic field generator 24 and Hall sensor 122 is similar to Hall sensor 26.

The first Helmholtz coil 124 and the second Helmholtz coil 126 are substantially identical, circular magnetic coils placed symmetrically on each side of Hall sensor 122 along a common axis. First and second Helmholtz coils 124 and 126 are separated by a distance h that is equal to the radius of one of the coils 124 and 126. Each of the coils 124 and 126 carries an equal electrical current I flowing in the same direction.

Current I1 at 130 is passed through coil 124 and the magnetic field about each turn of wire links with the magnetic fields of adjacent turns to produce a magnetic field. Current I2 at 132 is passed through coil 126 and the magnetic field about each turn of wire links with the magnetic fields of adjacent turns to produce a magnetic field. The resulting magnetic field at 128 is a uniform, homogeneous magnetic field that extends from first Helmholtz coil 124 through second Helmholtz coil 126.

Hall sensor 122 includes a first Hall plate 134, a second Hall plate 136 and an amplifier (not shown). First and second Hall plates 134 and 136 are situated in the same homogeneous magnetic field 128. Hall sensor 122 can be situated in the homogeneous magnetic field at 128 in normal mode or in test mode.

In operation, controller 22 controls magnetic field generator 120 to provide the homogeneous magnetic field at 128. First and second Hall plates 134 and 136 are situated in the same homogeneous magnetic field 128 and measurements are taken from Hall sensor 122 in normal mode and/or inverted mode in the homogeneous magnetic field 128.

Figure 4:
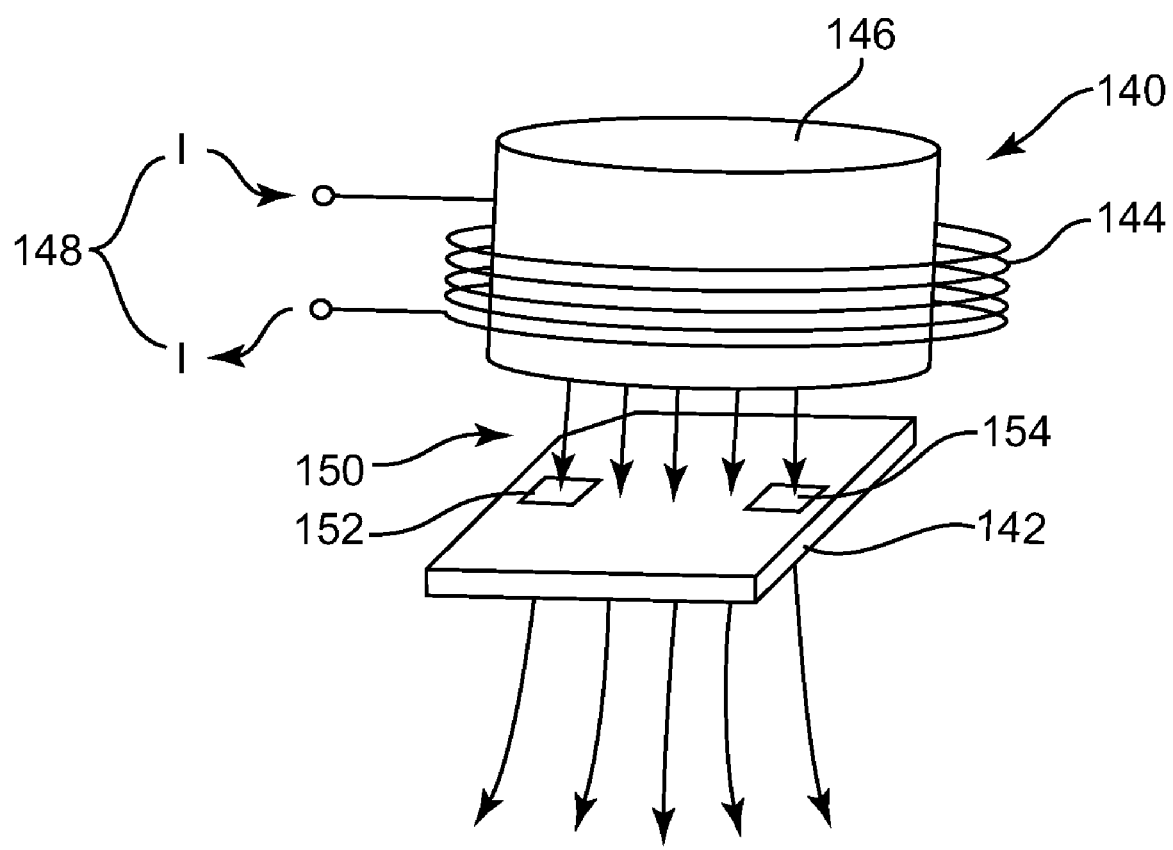
FIG. 4 is a diagram illustrating one embodiment of a homogenous magnetic field generator that includes a ferrite core, and a differential Hall effect sensor.

FIG. 4 is a diagram illustrating one embodiment of another homogeneous magnetic field generator 140 and a differential Hall effect sensor, referred to as Hall sensor 142. Magnetic field generator 140 is similar to magnetic field generator 24 and Hall sensor 142 is similar to Hall sensor 26.

Magnetic field generator 140 includes a coil 144 and a ferrite core 146. Current I at 148 is passed through coil 144 and the magnetic field about each turn of wire links with the magnetic fields of adjacent turns to produce a driving magnetic field. Ferrite core 146 receives the driving magnetic field and the ferromagnetic property of the ferrite core 146 causes the internal magnetic domains of the iron to line up with the smaller driving magnetic field produced by the current I in coil 144. The effect is the multiplication of the driving magnetic field by a factor of tens to even thousands. The resulting magnetic field at 150 is a uniform, homogeneous magnetic field that extends from ferrite core 146 through Hall sensor 142.

Hall sensor 142 includes a first Hall plate 152, a second Hall plate 154 and an amplifier (not shown). First and second Hall plates 152 and 154 are situated in the same homogeneous magnetic field 150. Hall sensor 142 can be situated in the homogeneous magnetic field at 150 in normal mode or in test mode.

In operation, controller 22 controls magnetic field generator 140 to provide the homogeneous magnetic field at 150. First and second Hall plates 152 and 154 are situated in the same homogeneous magnetic field 150 and measurements are taken from Hall sensor 142 in normal mode and/or inverted mode.

Figure 5:
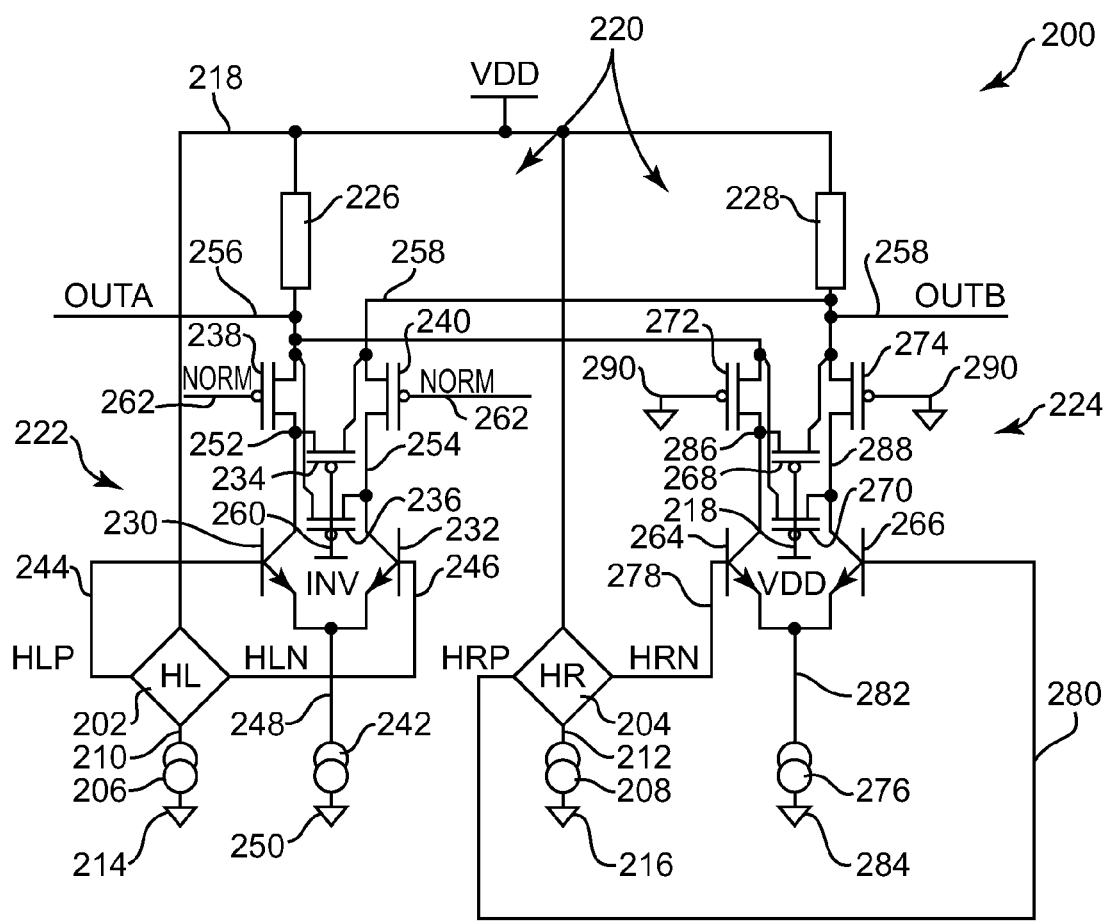
FIG. 5 is a diagram illustrating one embodiment of a differential Hall effect sensor that selectively crosses outputs of a differential pair of input transistors.

FIG. 5 is a diagram illustrating one embodiment of a differential Hall effect sensor 200 that can be tested in a homogeneous magnetic field. Hall sensor 200 is similar to Hall sensor 26 (shown in FIG. 1) and can be tested in system 20 of FIG. 1.

Hall sensor 200 includes a left Hall plate 202, a right Hall plate 204, a left current source 206 and a right current source 208. Left Hall plate 202 is electrically coupled to left current source 206 via left current source path 210, and right Hall plate 204 is electrically coupled to right current source 208 via right current source path 212. Left current source 206 is electrically coupled to a reference, such as ground, at 214 and right current source 208 is electrically coupled to a reference, such as ground, at 216. Left Hall plate 202 and right Hall plate 204 are electrically coupled to power VDD via power supply path 218. Left current source 206 provides a left Hall plate current through left Hall plate 202 and right current source 208 provides a right Hall plate current through right Hall plate 204. In one embodiment, the magnitude and direction of the left Hall plate current is the same as the magnitude and direction of the right Hall plate current.

Left Hall plate 202 and right Hall plate 204 are situated in a magnetic field to provide Hall voltages. Left Hall plate 202 provides a first Hall voltage and includes a left Hall plate positive voltage side HLP and a left Hall plate negative voltage side HLN. Right Hall plate 204 provides a second Hall voltage and includes a right Hall plate positive voltage side HRP and a right Hall plate negative voltage side HRN. Left Hall plate 202 and right Hall plate 204 are situated in Hall sensor 200 such that the left Hall plate positive voltage side HLP and the right Hall plate positive voltage side HRP face the same direction, and the left Hall plate negative voltage side HLN and the right Hall plate negative voltage side HRN face the same and opposite direction.

Hall sensor 200 includes a four input amplifier 220 that includes a first input stage 222, a second input stage 224, a first load impedance 226 and a second load impedance 228. First input stage 222 is electrically coupled to left Hall plate 202 to receive the first Hall voltage, and second input stage 224 is electrically coupled to right Hall plate 204 to receive the second Hall voltage.

First input stage 222 includes a first differential pair of input transistors 230 and 232, first and second cross-over transistors 234 and 236, first and second blocking transistors 238 and 240 and first input stage current source 242. Each of the first differential pair of input transistors 230 and 232 is a bipolar transistor. Each of the first and second cross-over transistors 234 and 236 and each of the first and second blocking transistors 238 and 240 is a p-channel metal oxide semiconductor (PMOS) transistor.

The base of input transistor 230 is electrically coupled to the left Hall plate positive voltage side HLP via left positive side path 244, and the base of input transistor 232 is electrically coupled to the left Hall plate negative voltage side HLN via left negative side path 246. The emitters of input transistors 230 and 232 are electrically coupled together and to first input stage current source 242 via first current source path 248. First input stage current source 242 is electrically coupled to a reference, such as ground, at 250.

The collector of input transistor 230 is electrically coupled to one side of the drain-source path of first cross-over transistor 234 and to one side of the drain-source path of first blocking transistor 238 via first collector path 252. The collector of input transistor 232 is electrically coupled to one side of the drain-source path of second cross-over transistor 236 and to one side of the drain-source path of second blocking transistor 240 via second collector path 254. The other side of the drain-source path of first blocking transistor 238 is electrically coupled to the other side of the drain-source path of second cross-over transistor 236 and to one side of first load impedance 226 via first output path 256. The other side of the drain-source path of second blocking transistor 240 is electrically coupled to the other side of the drain-source path of first cross-over transistor 234 and to one side of second load impedance 228 via second output path 258. Each of the gates of the first and second cross-over transistors 234 and 236 is electrically coupled to a test mode or inverted mode signal INV at 260. Each of the gates of the first and second blocking transistors 238 and 240 is electrically coupled to a normal mode signal NORM at 262.

Second input stage 224 includes a second differential pair of input transistors 264 and 266, third and fourth cross-over transistors 268 and 270, third and fourth blocking transistors 272 and 274 and second input stage current source 276. Each of the second differential pair of input transistors 264 and 266 is a bipolar transistor. Each of the third and fourth cross-over transistors 268 and 270 and each of the third and fourth blocking transistors 272 and 274 is a PMOS transistor.

The base of input transistor 264 is electrically coupled to the right Hall plate negative voltage side HRN via right negative side path 278, and the base of input transistor 266 is electrically coupled to the right Hall plate positive voltage side HRP via right positive side path 280. The emitters of input transistors 264 and 266 are electrically coupled together and to second input stage current source 276 via second current source path 282. Second input stage current source 276 is electrically coupled to a reference, such as ground, at 284.

The collector of input transistor 264 is electrically coupled to one side of the drain-source path of third cross-over transistor 268 and to one side of the drain-source path of third blocking transistor 272 via third collector path 286. The collector of input transistor 266 is electrically coupled to one side of the drain-source path of fourth cross-over transistor 270 and to one side of the drain-source path of fourth blocking transistor 274 via fourth collector path 288. The other side of the drain-source path of third blocking transistor 272 is electrically coupled to the other side of the drain-source path of fourth cross-over transistor 270 and to one side of first load impedance 226 via first output path 256. The other side of the drain-source path of fourth blocking transistor 274 is electrically coupled to the other side of the drain-source path of third cross-over transistor 268 and to one side of second load impedance 228 via second output path 258. The other sides of first and second load impedances 226 and 228 are electrically coupled to power VDD via power supply path 218. Also, each of the gates of third and fourth cross-over transistors 268 and 270 is electrically coupled to power VDD via power supply path 218, and each of the gates of third and fourth blocking transistors 272 and 274 is electrically coupled to a reference, such as ground, at 290.

In normal mode, inverted mode signal INV at 260 is at a high voltage level that switches off cross-over transistors 234 and 236 and normal mode signal NORM at 262 is at a low voltage level that switches on blocking transistors 238 and 240. Cross-over transistors 268 and 270 are switched off via power VDD at 218 and blocking transistors 272 and 274 are switched on via the reference at 290.

In normal mode and in a differential magnetic field, the voltages on the left Hall plate positive voltage side HLP and the right Hall plate negative voltage side HRN are substantially the same and bias on input transistors 230 and 264, respectively. Also, the voltages on the left Hall plate negative voltage side HLN and the right Hall plate positive voltage side HRP are substantially the same and bias on input transistors 232 and 266, respectively. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

The current through input transistors 230 and 264 flows through first load impedance 226 and the voltage at first output OUTA is VDD minus the voltage across first load impedance 226. The current through input transistors 232 and 266 flows through second load impedance 228 and the voltage at second output OUTB is VDD minus the voltage across second load impedance 228. The voltage at first output OUTA corresponds to the voltages on the left Hall plate positive voltage side HLP and the right Hall plate negative voltage side HRN. The voltage at second output OUTB corresponds to the voltages on the left Hall plate negative voltage side HLN and the right Hall plate positive voltage side HRP. This is the normal mode of operation of Hall sensor 200.

In normal mode and in a homogenous magnetic field, the voltages on the left Hall plate positive voltage side HLP and the right Hall plate positive voltage side HRP are substantially the same voltage value. Also, the voltages on the left Hall plate negative voltage side HLN and the right Hall plate negative voltage side HRN are substantially the same voltage value. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

Since, the voltages on the left Hall plate positive voltage side HLP and the right Hall plate negative voltage side HRN bias on input transistors 230 and 264, respectively, and the voltages on the left Hall plate negative voltage side HLN and the right Hall plate positive voltage side HRP bias on input transistors 232 and 266, respectively, the current through input transistors 230 and 264 is the same magnitude as the current through input transistors 232 and 266. With first load impedance 226 equal to second load impedance 228, the voltage at first output OUTA is the same as the voltage at second output OUTB, such that the difference is zero. Also, the voltage at first output OUTA corresponds to the voltages on the left Hall plate positive voltage side HLP and the right Hall plate negative voltage side HRN and the voltage at second output OUTB corresponds to the voltages on the left Hall plate negative voltage side HLN and the right Hall plate positive voltage side HRP.

In inverted mode, inverted mode signal INV at 260 is at a low voltage level that switches on cross-over transistors 234 and 236 and normal mode signal NORM at 262 is at a high voltage level that switches off blocking transistors 238 and 240. Cross-over transistors 268 and 270 are switched off via power VDD at 218 and blocking transistors 272 and 274 are switched on via the reference at 290.

In inverted mode and in a homogeneous magnetic field, the voltages on the left Hall plate positive voltage side HLP and the right Hall plate positive voltage side HRP are substantially the same and bias on input transistors 230 and 266, respectively. Also, the voltages on the left Hall plate negative voltage side HLN and the right Hall plate negative voltage side HRN are substantially the same and bias on input transistors 232 and 264, respectively. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

The current through input transistors 232 and 264 flows through first load impedance 226 and the voltage at first output OUTA is VDD minus the voltage across first load impedance 226. The current through input transistors 230 and 266 flows through second load impedance 228 and the voltage at second output OUTB is VDD minus the voltage across second load impedance 228. The voltage at first output OUTA corresponds to the voltages on the left Hall plate negative voltage side HLN and the right Hall plate negative voltage side HRN. The voltage at second output OUTB corresponds to the voltages on the left Hall plate positive voltage side HLP and the right Hall plate positive voltage side HRP. This is the test mode of operation of Hall sensor 200 in a homogeneous magnetic field.

In inverted mode and in a differential magnetic field, the voltages on the left Hall plate positive voltage side HLP and the right Hall plate negative voltage side HRN are substantially the same voltage value. Also, the voltages on the left Hall plate negative voltage side HLN and the right Hall plate positive voltage side HRP are substantially the same voltage value. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

Since, the voltages on the left Hall plate positive voltage side HLP and the right Hall plate positive voltage side HRP bias on input transistors 230 and 266, respectively, and the voltages on the left Hall plate negative voltage side HLN and the right Hall plate negative voltage side HRN bias on input transistors 232 and 264, respectively, the current through input transistors 230 and 266 is the same magnitude as the current through input transistors 232 and 264. With first load impedance 226 equal to second load impedance 228, the voltage at first output OUTA is the same as the voltage at second output OUTB, such that the difference is zero. Also, the voltage at first output OUTA corresponds to the voltages on the left Hall plate negative voltage side HLN and the right Hall plate negative voltage side HRN and the voltage at second output OUTB corresponds to the voltages on the left Hall plate positive voltage side HLP and the right Hall plate positive voltage side HRP. This is the test mode operation of Hall sensor 200 in a differential magnetic field.

Figure 6:
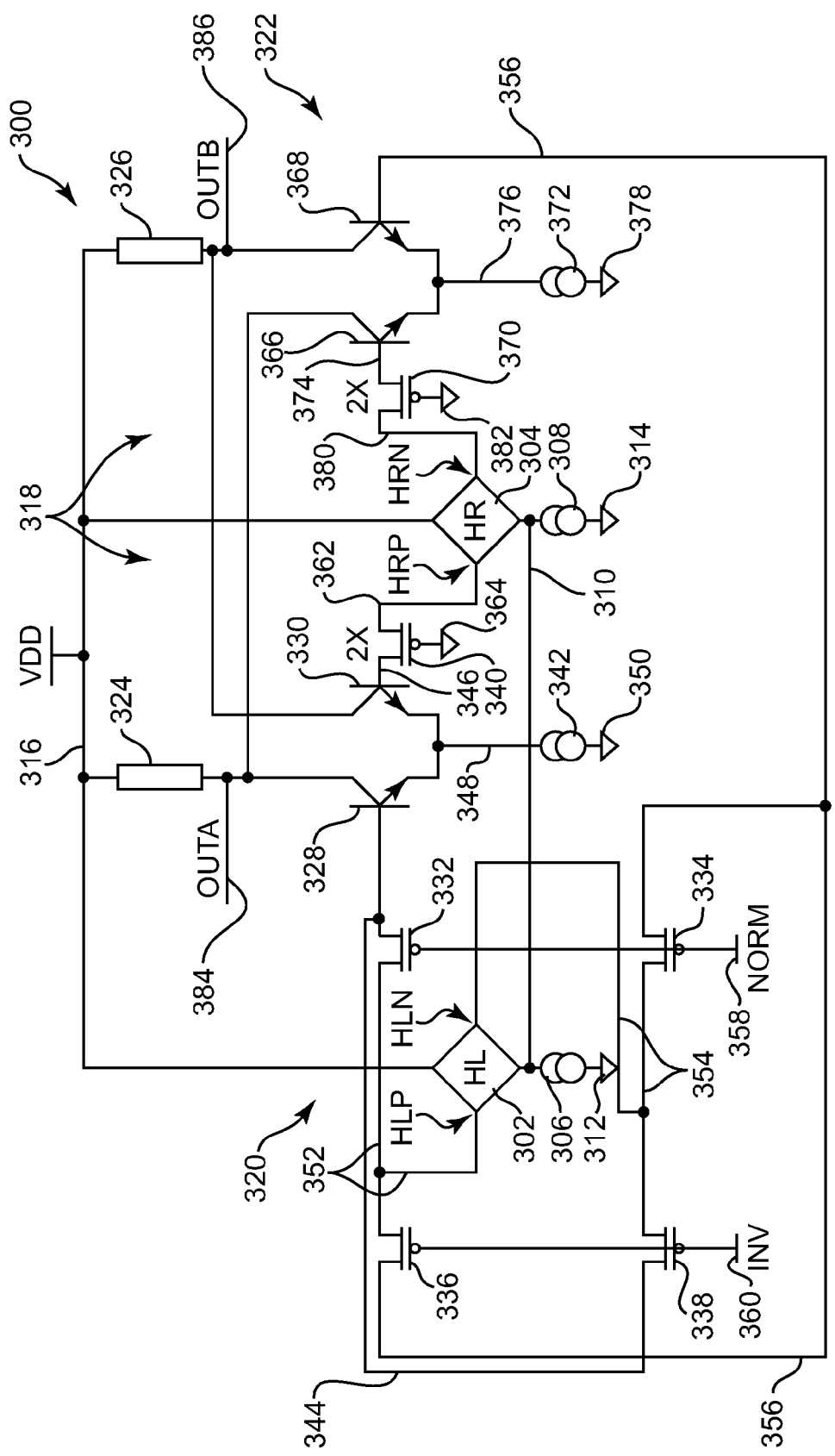
FIG. 6 is diagram illustrating one embodiment of a differential Hall effect sensor that selectively crosses Hall plate outputs to inputs of an amplifier.

FIG. 6 is a diagram illustrating one embodiment of a differential Hall effect sensor 300 that crosses Hall plate outputs from one Hall plate to inputs of an amplifier in test mode. Hall sensor 300 can be tested in a homogeneous magnetic field. Hall sensor 300 is similar to Hall sensor 26 (shown in FIG. 1) and can be tested in system 20 of FIG. 1.

Hall sensor 300 includes a left Hall plate 302, a right Hall plate 304, a left current source 306 and a right current source 308. Left Hall plate 302 is electrically coupled to left current source 306 and to right current source 308 via current source path 310. Right Hall plate 304 is electrically coupled to left current source 306 and to right current source 308 via current source path 310. Left current source 306 is electrically coupled to a reference, such as ground, at 312 and right current source 308 is electrically coupled to a reference, such as ground, at 314. Left Hall plate 302 and right Hall plate 304 are electrically coupled to power VDD via power supply path 316. Left and right current sources 306 and 308 provide a left Hall plate current through left Hall plate 302 and a right Hall plate current through right Hall plate 304. In one embodiment, the magnitude and direction of the left Hall plate current is the same as the magnitude and direction of the right Hall plate current.

Left Hall plate 302 and right Hall plate 304 are situated in a magnetic field to provide Hall voltages. Left Hall plate 302 provides a first Hall voltage and includes a left Hall plate positive voltage side HLP and a left Hall plate negative voltage side HLN. Right Hall plate 304 provides a second Hall voltage and includes a right Hall plate positive voltage side HRP and a right Hall plate negative voltage side HRN. Left Hall plate 302 and right Hall plate 304 are situated in Hall sensor 300 such that the left Hall plate positive voltage side HLP and the right Hall plate positive voltage side HRP face the same direction, and the left Hall plate negative voltage side HLN and the right Hall plate negative voltage side HRN face the same and opposite direction.

Hall sensor 300 includes a four input amplifier 318 that includes a first input stage 320, a second input stage 322, a first load impedance 324 and a second load impedance 326.

First input stage 320 includes a first differential pair of input transistors 328 and 330, first and second normal mode pass transistors 332 and 334, first and second cross-over transistors 336 and 338, a first input load transistor 340 and first input stage current source 342. Each of the first differential pair of input transistors 328 and 330 is a bipolar transistor. Each of the first and second normal mode pass transistors 332 and 334 and each of the first and second cross-over transistors 336 and 338 is a 1× PMOS transistor. First input load transistor 340 is a 2× PMOS transistor.

The base of input transistor 328 is electrically coupled to one side of the drain-source path of first pass transistor 332 and to one side of the drain-source path of second cross-over transistor 338 via input path 344. The base of input transistor 330 is electrically coupled to one side of the drain-source path of first input load transistor 340 via input path 346. The emitters of input transistors 328 and 330 are electrically coupled together and to first input stage current source 342 via first current source path 348. First input stage current source 342 is electrically coupled to a reference, such as ground, at 350.

The other side of the drain-source path of first pass transistor 332 is electrically coupled to one side of the drain-source path of first cross-over transistor 336 and to the left Hall plate positive voltage side HLP via left positive side path 352. The other side of the drain-source path of second cross-over transistor 338 is electrically coupled to one side of the drain-source path of second pass transistor 334 and to the left Hall plate negative voltage side HLN via left negative side path 354. The other side of the drain-source path of second pass transistor 334 is electrically coupled to the other side of the drain-source path of first cross-over transistor 336 via input path 356. Each of the gates of the first and second pass transistors 332 and 334 is electrically coupled to normal mode signal NORM at 358. Each of the gates of the first and second cross-over transistors 336 and 338 is electrically coupled to a test mode or inverted mode signal INV at 360. The other side of first input load transistor 340 is electrically coupled to the right Hall plate positive voltage side HRP via right positive side path 362 and the gate of first input load transistor 340 is electrically coupled to a reference, such as ground, at 364.

Second input stage 322 includes a second differential pair of input transistors 366 and 368, second input load transistor 370 and second input stage current source 372. Each of the second differential pair of input transistors 366 and 368 is a bipolar transistor, and second input load transistor 370 is a 2× PMOS transistor.

The base of input transistor 366 is electrically coupled to one side of the drain-source path of second input load transistor 370 via input path 374. The base of input transistor 368 is electrically coupled to the drain-source path of second pass transistor 334 and to the drain-source path of first cross-over transistor 336 via input path 356. The emitters of input transistors 366 and 368 are electrically coupled together and to second input stage current source 372 via second current source path 376. Second input stage current source 372 is electrically coupled to a reference, such as ground, at 378. The other side of second input load transistor 370 is electrically coupled to the right Hall plate negative voltage side HRN via right negative side path 380 and the gate of second input load transistor 370 is electrically coupled to a reference, such as ground, at 382.

The collector of input transistor 328 is electrically coupled to the collector of input transistor 366 and to one side of first load impedance 324 via first output path 384. The collector of input transistor 330 is electrically coupled to the collector of input transistor 368 and to one side of second load impedance 326 via second output path 386. The other sides of first and second load impedances 324 and 326 are electrically coupled to power VDD via power supply path 316.

In normal mode, inverted mode signal INV at 360 is at a high voltage level that switches off cross-over transistors 336 and 338 and normal mode signal NORM at 358 is at a low voltage level that switches on pass transistors 332 and 334. First and second input load transistors 340 and 370 are switched on via the references at 364 and 382.

In normal mode and in a differential magnetic field, the voltages on the left Hall plate positive voltage side HLP and the right Hall plate negative voltage side HRN are substantially the same and bias on input transistors 328 and 366, respectively. Also, the voltages on the left Hall plate negative voltage side HLN and the right Hall plate positive voltage side HRP are substantially the same and bias on input transistors 330 and 368, respectively. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

The current through input transistors 328 and 366 flows through first load impedance 324 and the voltage at first output OUTA at 384 is VDD minus the voltage across first load impedance 324. The current through input transistors 330 and 368 flows through second load impedance 326 and the voltage at second output OUTB at 386 is VDD minus the voltage across second load impedance 326. The voltage at first output OUTA corresponds to the voltages on the left Hall plate positive voltage side HLP and the right Hall plate negative voltage side HRN. The voltage at second output OUTB corresponds to the voltages on the left Hall plate negative voltage side HLN and the right Hall plate positive voltage side HRP. This is the normal mode of operation of Hall sensor 300.

In normal mode and in a homogenous magnetic field, the voltages on the left Hall plate positive voltage side HLP and the right Hall plate positive voltage side HRP are substantially the same voltage value. Also, the voltages on the left Hall plate negative voltage side HLN and the right Hall plate negative voltage side HRN are substantially the same voltage value. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

Since, the voltages on the left Hall plate positive voltage side HLP and the right Hall plate negative voltage side HRN bias on input transistors 328 and 366, respectively, and the voltages on the left Hall plate negative voltage side HLN and the right Hall plate positive voltage side HRP bias on input transistors 330 and 368, respectively, the current through input transistors 328 and 366 is the same magnitude as the current through input transistors 330 and 368. With first load impedance 324 equal to second load impedance 326, the voltage at first output OUTA is the same as the voltage at second output OUTB, such that the difference is zero. Also, the voltage at first output OUTA corresponds to the voltages on the left Hall plate positive voltage side HLP and the right Hall plate negative voltage side HRN and the voltage at second output OUTB corresponds to the voltages on the left Hall plate negative voltage side HLN and the right Hall plate positive voltage side HRP.

In inverted mode, inverted mode signal INV at 360 is at a low voltage level that switches on cross-over transistors 336 and 338 and normal mode signal NORM at 358 is at a high voltage level that switches off pass transistors 332 and 334. First and second input load transistors 340 and 370 are switched on via the references at 364 and 382.

In inverted mode and in a homogeneous magnetic field, the voltages on the left Hall plate positive voltage side HLP and the right Hall plate positive voltage side HRP are substantially the same and bias on input transistors 330 and 368, respectively. Also, the voltages on the left Hall plate negative voltage side HLN and the right Hall plate negative voltage side HRN are substantially the same and bias on input transistors 328 and 366, respectively. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

The current through input transistors 328 and 366 flows through first load impedance 324 and the voltage at first output OUTA is VDD minus the voltage across first load impedance 324. The current through input transistors 330 and 368 flows through second load impedance 326 and the voltage at second output OUTB is VDD minus the voltage across second load impedance 326. The voltage at first output OUTA corresponds to the voltages on the left Hall plate negative voltage side HLN and the right Hall plate negative voltage side HRN. The voltage at second output OUTB corresponds to the voltages on the left Hall plate positive voltage side HLP and the right Hall plate positive voltage side HRP. This is the test mode of operation of Hall sensor 300 in a homogeneous magnetic field.

In inverted mode and in a differential magnetic field, the voltages on the left Hall plate positive voltage side HLP and the right Hall plate negative voltage side HRN are substantially the same voltage value. Also, the voltages on the left Hall plate negative voltage side HLN and the right Hall plate positive voltage side HRP are substantially the same voltage value. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

Since, the voltages on the left Hall plate positive voltage side HLP and the right Hall plate positive voltage side HRP bias on input transistors 330 and 368, respectively, and the voltages on the left Hall plate negative voltage side HLN and the right Hall plate negative voltage side HRN bias on input transistors 328 and 366, respectively, the current through input transistors 330 and 368 is the same magnitude as the current through input transistors 328 and 366. With first load impedance 324 equal to second load impedance 326, the voltage at first output OUTA is the same as the voltage at second output OUTB, such that the difference is zero. Also, the voltage at first output OUTA corresponds to the voltages on the left Hall plate negative voltage side HLN and the right Hall plate negative voltage side HRN and the voltage at second output OUTB corresponds to the voltages on the left Hall plate positive voltage side HLP and the right Hall plate positive voltage side HRP. This is the test mode operation of Hall sensor 300 in a differential magnetic field.

Figure 7:
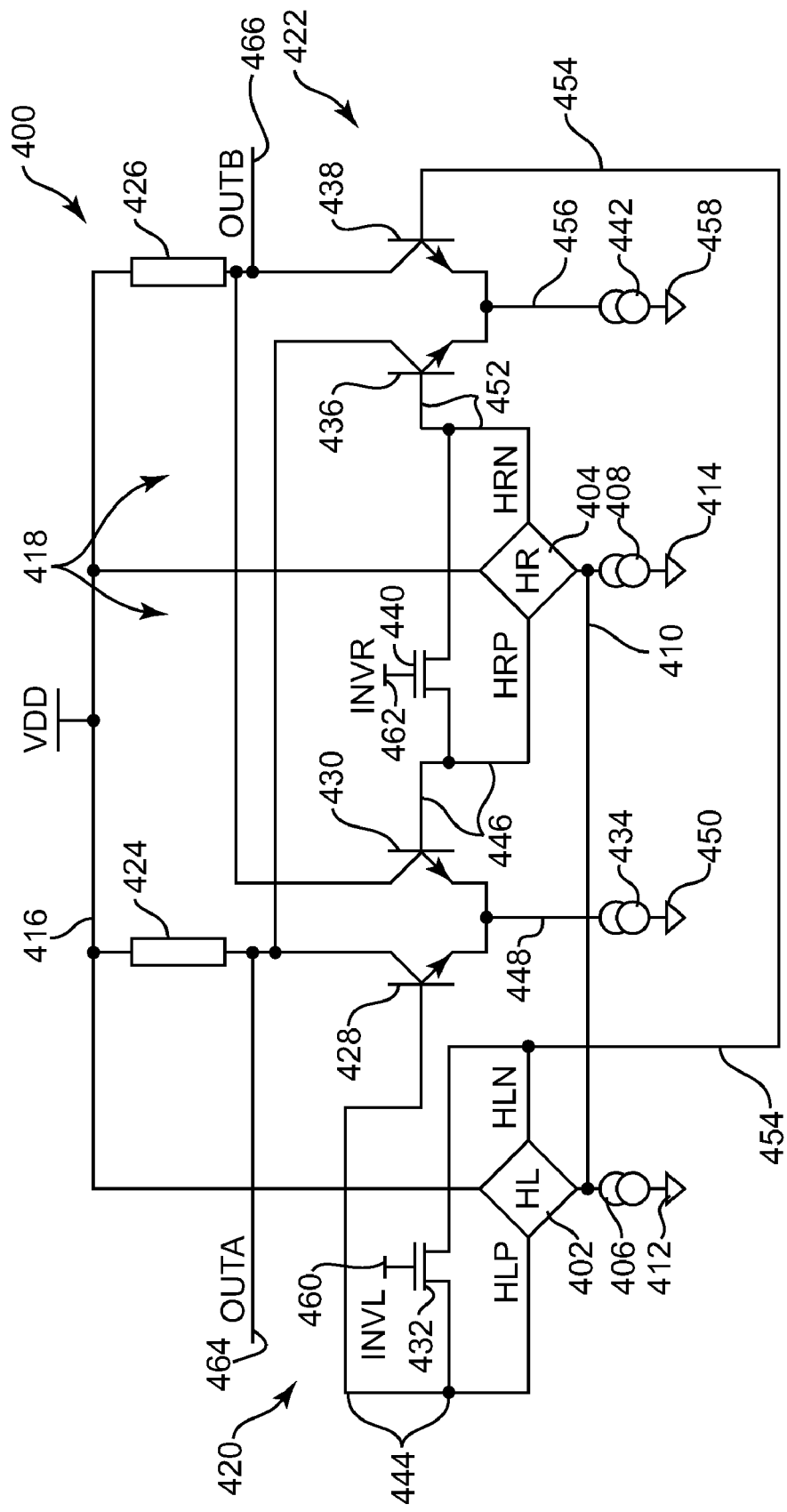
FIG. 7 is a diagram illustrating one embodiment of a differential Hall effect sensor that selectively shorts the Hall voltages of two Hall plates.

FIG. 7 is a diagram illustrating one embodiment of a differential Hall effect sensor 400 configured to short the Hall voltages of a left Hall plate 402 and/or a right Hall plate 404. Hall sensor 400 can be tested in a homogeneous magnetic field. Hall sensor 400 is similar to Hall sensor 26 (shown in FIG. 1) and can be tested in system 20 of FIG. 1.

Hall sensor 400 includes left Hall plate 402, right Hall plate 404, a left current source 406 and a right current source 408. Left Hall plate 402 is electrically coupled to left current source 406 and to right current source 408 via current source path 410. Right Hall plate 404 is electrically coupled to left current source 406 and to right current source 408 via current source path 410. Left current source 406 is electrically coupled to a reference, such as ground, at 412 and right current source 408 is electrically coupled to a reference, such as ground, at 414. Left Hall plate 402 and right Hall plate 404 are electrically coupled to power VDD via power supply path 416. Left and right current sources 406 and 408 provide a left Hall plate current through left Hall plate 402 and a right Hall plate current through right Hall plate 404. In one embodiment, the magnitude and direction of the left Hall plate current is the same as the magnitude and direction of the right Hall plate current.

Left Hall plate 402 and right Hall plate 404 are situated in a magnetic field to provide Hall voltages. Left Hall plate 402 provides a first Hall voltage and includes a left Hall plate positive voltage side HLP and a left Hall plate negative voltage side HLN. Right Hall plate 404 provides a second Hall voltage and includes a right Hall plate positive voltage side HRP and a right Hall plate negative voltage side HRN. Left Hall plate 402 and right Hall plate 404 are situated in Hall sensor 400 such that the left Hall plate positive voltage side HLP and the right Hall plate positive voltage side HRP face the same direction, and the left Hall plate negative voltage side HLN and the right Hall plate negative voltage side HRN face the same and opposite direction.

Hall sensor 400 includes a four input amplifier 418 that includes a first input stage 420, a second input stage 422, a first load impedance 424 and a second load impedance 426. First input stage 420 includes a first differential pair of input transistors 428 and 430, a first shorting transistor 432 and a first input stage current source 434. Second input stage 422 includes a second differential pair of input transistors 436 and 438, a second shorting transistor 440 and a second input stage current source 442. Each of the first differential pair of input transistors 428 and 430 and each of the second differential pair of input transistors 436 and 438 is a bipolar transistor. Each of the first and second shorting transistors 432 and 440 is a PMOS transistor.

The base of input transistor 428 is electrically coupled to one side of the drain-source path of first shorting transistor 432 and to the left Hall plate positive voltage side HLP via left positive side path 444. The base of input transistor 430 is electrically coupled to one side of the drain-source path of second shorting transistor 440 and to the right Hall plate positive voltage side HRP via right positive side path 446. The emitters of input transistors 428 and 430 are electrically coupled together and to first input stage current source 434 via first current source path 448. First input stage current source 434 is electrically coupled to a reference, such as ground, at 450.

The base of input transistor 436 is electrically coupled to the other side of the drain-source path of second shorting transistor 440 and to the right Hall plate negative voltage side HRN via right negative side path 452. The base of input transistor 438 is electrically coupled to the other side of the drain-source path of first shorting transistor 432 and to the left Hall plate negative voltage side HLN via left negative side path 454. The emitters of input transistors 436 and 438 are electrically coupled together and to second input stage current source 442 via second current source path 456. Second input stage current source 442 is electrically coupled to a reference, such as ground, at 458.

The gate of first shorting transistor 432 receives left test mode or left inverted mode signal INVL at 460 and the gate of second shorting transistor 440 receives right test mode or right inverted mode signal INVR at 462.

The collector of input transistor 428 is electrically coupled to the collector of input transistor 436 and to one side of first load impedance 424 via first output path 464. The collector of input transistor 430 is electrically coupled to the collector of input transistor 438 and to one side of second load impedance 426 via second output path 466. The other sides of first and second load impedances 424 and 426 are electrically coupled to power VDD via power supply path 416.

In normal mode, left inverted mode signal INVL at 460 and right inverted mode signal INVR at 462 are at high voltage levels that switch off shorting transistors 432 and 440.

In normal mode and in a differential magnetic field, the voltages on the left Hall plate positive voltage side HLP and the right Hall plate negative voltage side HRN are substantially the same and bias on input transistors 428 and 436, respectively. Also, the voltages on the left Hall plate negative voltage side HLN and the right Hall plate positive voltage side HRP are substantially the same and bias on input transistors 430 and 438, respectively. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

The current through input transistors 428 and 436 flows through first load impedance 424 and the voltage at first output OUTA at 464 is VDD minus the voltage across first load impedance 424. The current through input transistors 430 and 438 flows through second load impedance 426 and the voltage at second output OUTB at 466 is VDD minus the voltage across second load impedance 426. The voltage at first output OUTA corresponds to the voltages on the left Hall plate positive voltage side HLP and the right Hall plate negative voltage side HRN. The voltage at second output OUTB corresponds to the voltages on the left Hall plate negative voltage side HLN and the right Hall plate positive voltage side HRP. This is the normal mode of operation of Hall sensor 400.

In normal mode and in a homogenous magnetic field, the voltages on the left Hall plate positive voltage side HLP and the right Hall plate positive voltage side HRP are substantially the same voltage value. Also, the voltages on the left Hall plate negative voltage side HLN and the right Hall plate negative voltage side HRN are substantially the same voltage value. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

Since, the voltages on the left Hall plate positive voltage side HLP and the right Hall plate negative voltage side HRN bias on input transistors 428 and 436, respectively, and the voltages on the left Hall plate negative voltage side HLN and the right Hall plate positive voltage side HRP bias on input transistors 430 and 438, respectively, the current through input transistors 428 and 436 is the same magnitude as the current through input transistors 430 and 438. With first load impedance 424 equal to second load impedance 426, the voltage at first output OUTA is the same as the voltage at second output OUTB, such that the difference is zero. Also, the voltage at first output OUTA corresponds to the voltages on the left Hall plate positive voltage side HLP and the right Hall plate negative voltage side HRN and the voltage at second output OUTB corresponds to the voltages on the left Hall plate negative voltage side HLN and the right Hall plate positive voltage side HRP.

In inverted mode, one of the inverted mode signals INVL at 460 and INVR at 462 is at a low voltage level and the other one of the inverted mode signals INVL at 460 and INVR at 462 is at a high voltage level.

In a first inverted mode and in a homogeneous or differential magnetic field, the left inverted mode signal INVL at 460 is at a low voltage level, which switches on first shorting transistor 432, and the right inverted mode signal INVR is at a high voltage level, which switches off second shorting transistor 440. The first Hall voltage across first Hall plate 402 is shorted to zero volts and the voltage on the left Hall plate positive voltage side HLP is substantially equal to the voltage on the left Hall plate negative voltage side HLN. In one embodiment, the voltage on the left Hall plate positive voltage side HLP is zero and the voltage on the left Hall plate negative voltage side HLN is zero.

The voltage on the right Hall plate positive voltage side HRP biases on input transistor 430 and the voltage on the right Hall plate negative voltage side HRN biases on input transistor 436. Current through input transistor 436 flows through first load impedance 424 and the voltage at first output OUTA is VDD minus the voltage across first load impedance 424. Current through input transistor 430 flows through second load impedance 426 and the voltage at second output OUTB is VDD minus the voltage across second load impedance 426. The difference between first output OUTA at 464 and second output OUTB at 466 corresponds to the magnetic field strength and direction. In one aspect, the voltage at first output OUTA at 464 corresponds to the voltages on the right Hall plate negative voltage side HRN and either the left Hall plate negative voltage side HLN or the left Hall plate positive voltage side HLP. In one aspect, the voltage at second output OUTB at 466 corresponds to the voltages on the right Hall plate positive voltage side HRP and either the left Hall plate positive voltage side HLP or the left Hall plate negative voltage side HLN.

In a second inverted mode and in a homogeneous or differential magnetic field, the right inverted mode signal INVR at 462 is at a low voltage level, which switches on second shorting transistor 440, and the left inverted mode signal INVL is at a high voltage level, which switches off first shorting transistor 432. The second Hall voltage across second Hall plate 404 is shorted to zero volts and the voltage on the right Hall plate positive voltage side HRP is substantially equal to the voltage on the right Hall plate negative voltage side HRN. In one embodiment, the voltage on the right Hall plate positive voltage side HRP is zero and the voltage on the right Hall plate negative voltage side HLN is zero.

The voltage on the left Hall plate positive voltage side HLP biases on input transistor 428 and the voltage on the left Hall plate negative voltage side HLN biases on input transistor 438. Current through input transistor 428 flows through first load impedance 424 and the voltage at first output OUTA is VDD minus the voltage across first load impedance 424. Current through input transistor 438 flows through second load impedance 426 and the voltage at second output OUTB is VDD minus the voltage across second load impedance 426. The difference between first output OUTA and second output OUTB corresponds to the magnetic field strength and direction. In one aspect, the voltage at first output OUTA at 464 corresponds to the voltages on the left Hall plate positive voltage side HLP and either the right Hall plate negative voltage side HRN or the right Hall plate positive voltage side HRP. In one aspect, the voltage at second output OUTB at 466 corresponds to the voltages on the left Hall plate negative voltage side HLN and either the right Hall plate negative voltage side HRN or the right Hall plate positive voltage side HRP. Hall sensor 400 can be tested in a homogeneous magnetic field or a differential magnetic field via the first and second inverted modes.

Figure 8:
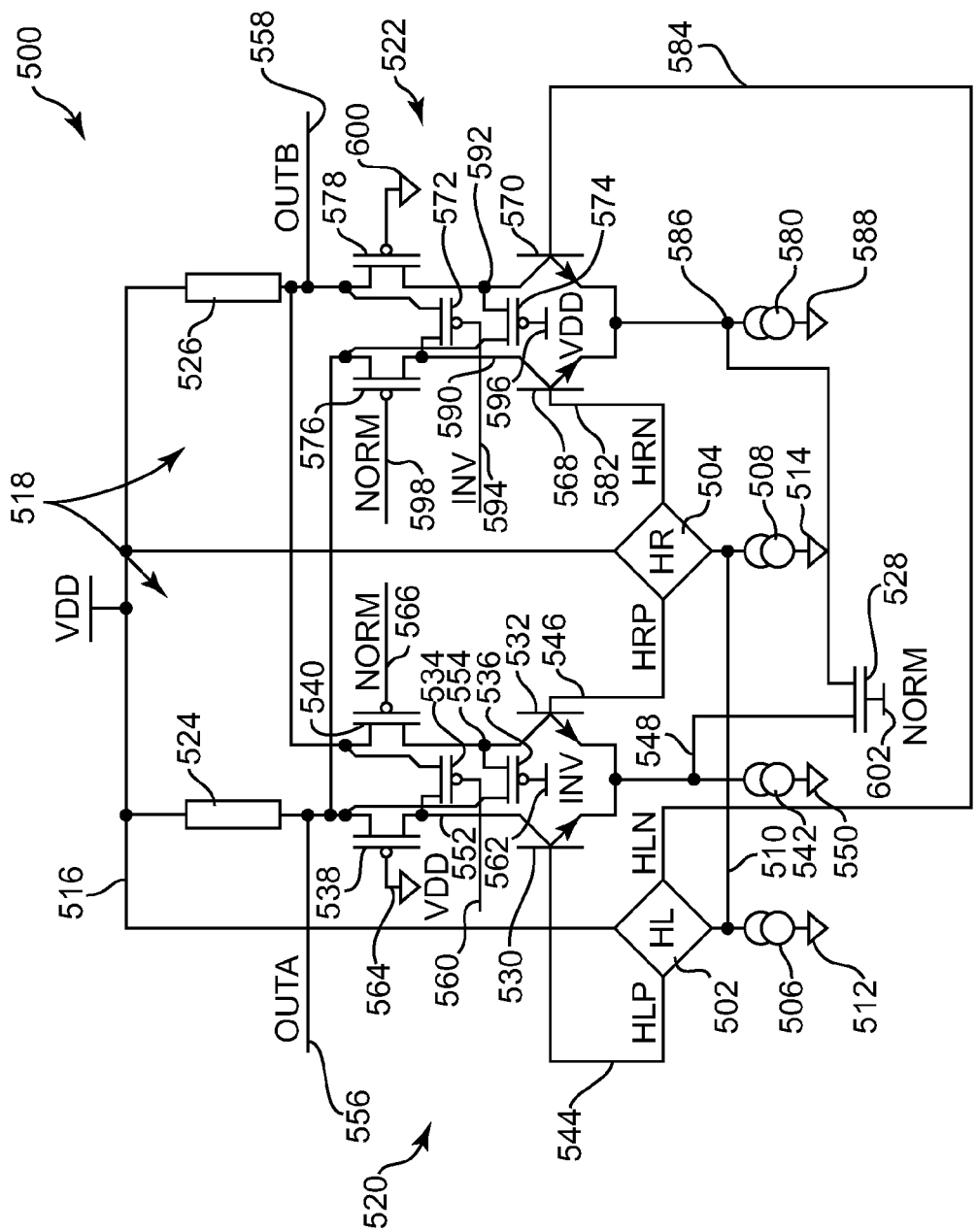
FIG. 8 is a diagram illustrating one embodiment of a differential Hall effect sensor that selectively crosses one output from each of two input stages.

FIG. 8 is a diagram illustrating one embodiment of a differential Hall effect sensor 500 configured to cross outputs from input stages in inverted mode. Hall sensor 500 is similar to Hall sensor 26 (shown in FIG. 1) and can be tested in system 20 of FIG. 1.

Hall sensor 500 includes a left Hall plate 502, a right Hall plate 504, a left current source 506 and a right current source 508. Left Hall plate 502 is electrically coupled to left current source 506 and to right current source 508 via current source path 510, and right Hall plate 504 is electrically coupled to left current source 506 and right current source 508 via current source path 510. Left current source 506 is electrically coupled to a reference, such as ground, at 512 and right current source 508 is electrically coupled to a reference, such as ground, at 514. Left Hall plate 502 and right Hall plate 504 are electrically coupled to power VDD via power supply path 516. Left and right current sources 506 and 508 provide a left Hall plate current through left Hall plate 502 and a right Hall plate current through right Hall plate 504. In one embodiment, the magnitude and direction of the left Hall plate current is the same as the magnitude and direction of the right Hall plate current.

Left Hall plate 502 and right Hall plate 504 are situated in a magnetic field to provide Hall voltages. Left Hall plate 502 provides a first Hall voltage and includes a left Hall plate positive voltage side HLP and a left Hall plate negative voltage side HLN. Right Hall plate 504 provides a second Hall voltage and includes a right Hall plate positive voltage side HRP and a right Hall plate negative voltage side HRN. Left Hall plate 502 and right Hall plate 504 are situated in Hall sensor 500 such that the left Hall plate positive voltage side HLP and the right Hall plate positive voltage side HRP face the same direction, and the left Hall plate negative voltage side HLN and the right Hall plate negative voltage side HRN face the same and opposite direction.

Hall sensor 500 includes a four input amplifier 518 that includes a first input stage 520, a second input stage 522, a first load impedance 524, a second load impedance 526 and a current source transistor 528. The gate of current source transistor 528 receives normal mode signal NORM at 602.

First input stage 520 includes a first differential pair of input transistors 530 and 532, first and second cross-over transistors 534 and 536, first and second blocking transistors 538 and 540 and first input stage current source 542. Each of the first differential pair of input transistors 530 and 532 is a bipolar transistor. Each of the first and second cross-over transistors 534 and 536 and each of the first and second blocking transistors 538 and 540 is a PMOS transistor. Also, current source transistor 528 is a PMOS transistor.

The base of input transistor 530 is electrically coupled to the left Hall plate positive voltage side HLP via left positive side path 544, and the base of input transistor 532 is electrically coupled to the right Hall plate positive voltage side HRP via right positive side path 546. The emitters of input transistors 530 and 532 are electrically coupled together and to first input stage current source 542 and to one side of the drain-source path of current source transistor 528 via first current source path 548. First input stage current source 542 is electrically coupled to a reference, such as ground, at 550.

The collector of input transistor 530 is electrically coupled to one side of the drain-source path of first cross-over transistor 534 and to one side of the drain-source path of first blocking transistor 538 via first collector path 552. The collector of input transistor 532 is electrically coupled to one side of the drain-source path of second cross-over transistor 536 and to one side of the drain-source path of second blocking transistor 540 via second collector path 554. The other side of the drain-source path of first blocking transistor 538 is electrically coupled to the other side of the drain-source path of second cross-over transistor 536 and to one side of first load impedance 524 via first output path 556. The other side of the drain-source path of second blocking transistor 540 is electrically coupled to the other side of the drain-source path of first cross-over transistor 534 and to one side of second load impedance 526 via second output path 558. The gate of first cross-over transistor 534 is electrically coupled to power VDD at 560 and the gate of second cross-over transistor 536 is electrically coupled to test mode or inverted mode signal INV at 562. The gate of first blocking transistor 538 is electrically coupled to a reference, such as ground, at 564, and the gate of second blocking transistor 540 is electrically coupled to a normal mode signal NORM at 566.

Second input stage 522 includes a second differential pair of input transistors 568 and 570, third and fourth cross-over transistors 572 and 574, third and fourth blocking transistors 576 and 578 and second input stage current source 580. Each of the second differential pair of input transistors 568 and 570 is a bipolar transistor. Each of the third and fourth cross-over transistors 572 and 574 and each of the third and fourth blocking transistors 576 and 578 is a PMOS transistor.

The base of input transistor 568 is electrically coupled to the right Hall plate negative voltage side HRN via right negative side path 582, and the base of input transistor 570 is electrically coupled to the left Hall plate negative voltage side HLN via left negative side path 584. The emitters of input transistors 568 and 570 are electrically coupled together and to second input stage current source 580 and the other side of the drain-source path of current source transistor 528 via second current source path 586. Second input stage current source 580 is electrically coupled to a reference, such as ground, at 588.

The collector of input transistor 568 is electrically coupled to one side of the drain-source path of third cross-over transistor 572 and to one side of the drain-source path of third blocking transistor 576 via third collector path 590. The collector of input transistor 570 is electrically coupled to one side of the drain-source path of fourth cross-over transistor 574 and to one side of the drain-source path of fourth blocking transistor 578 via fourth collector path 592. The other side of the drain-source path of third blocking transistor 576 is electrically coupled to the other side of the drain-source path of fourth cross-over transistor 574 and to one side of first load impedance 524 via first output path 556. The other side of the drain-source path of fourth blocking transistor 578 is electrically coupled to the other side of the drain-source path of third cross-over transistor 572 and to one side of second load impedance 526 via second output path 558. The other sides of first and second load impedances 524 and 526 are electrically coupled to power VDD via power supply path 516. Also, the gate of third cross-over transistor 572 is electrically coupled to inverted mode signal INV at 594, and the gate of fourth cross-over transistors 574 is electrically coupled to power VDD at 596. The gate of third blocking transistor 576 is electrically coupled to normal mode signal NORM at 598, and the gate of fourth blocking transistor 578 is electrically coupled to a reference, such as ground, at 600.

In normal mode, inverted mode signal INV at 562 and 594 is at a high voltage level that switches off cross-over transistors 536 and 572 and normal mode signal NORM at 566, 598 and 602 is at a low voltage level that switches on blocking transistors 540 and 576 and current source transistor 528. Cross-over transistors 534 and 574 are switched off via power VDD at 560 and 596 and blocking transistors 538 and 578 are switched on via the reference at 564 and 600.

In normal mode and in a differential magnetic field, the voltages on the left Hall plate positive voltage side HLP and the right Hall plate negative voltage side HRN are substantially the same and bias on input transistors 530 and 568, respectively. Also, the voltages on the left Hall plate negative voltage side HLN and the right Hall plate positive voltage side HRP are substantially the same and bias on input transistors 532 and 570, respectively. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

The current through input transistors 530 and 568 flows through first load impedance 524 and the voltage at first output OUTA is VDD minus the voltage across first load impedance 524. The current through input transistors 532 and 570 flows through second load impedance 526 and the voltage at second output OUTB is VDD minus the voltage across second load impedance 526. The voltage at first output OUTA corresponds to the voltages on the left Hall plate positive voltage side HLP and the right Hall plate negative voltage side HRN. The voltage at second output OUTB corresponds to the voltages on the left Hall plate negative voltage side HLN and the right Hall plate positive voltage side HRP. This is the normal mode of operation of Hall sensor 500.

In normal mode and in a homogenous magnetic field, the voltages on the left Hall plate positive voltage side HLP and the right Hall plate positive voltage side HRP are substantially the same voltage value. Also, the voltages on the left Hall plate negative voltage side HLN and the right Hall plate negative voltage side HRN are substantially the same voltage value. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

Since, the voltages on the left Hall plate positive voltage side HLP and the right Hall plate negative voltage side HRN bias on input transistors 530 and 568, respectively, and the voltages on the left Hall plate negative voltage side HLN and the right Hall plate positive voltage side HRP bias on input transistors 532 and 570, respectively, the current through input transistors 530 and 568 is the same magnitude as the current through input transistors 532 and 570. With first load impedance 524 equal to second load impedance 526, the voltage at first output OUTA is the same as the voltage at second output OUTB, such that the difference is zero. Also, the voltage at first output OUTA corresponds to the voltages on the left Hall plate positive voltage side HLP and the right Hall plate negative voltage side HRN and the voltage at second output OUTB corresponds to the voltages on the left Hall plate negative voltage side HLN and the right Hall plate positive voltage side HRP.

In inverted mode, inverted mode signal INV at 562 and 594 is at a low voltage level that switches on cross-over transistors 536 and 572 and normal mode signal NORM at 566, 598 and 602 is at a high voltage level that switches off blocking transistors 540 and 576 and current source transistor 528. Cross-over transistors 534 and 574 are switched off via power VDD at 560 and 596 and blocking transistors 538 and 578 are switched on via the reference at 564 and 600.

In inverted mode and in a homogeneous magnetic field, the voltages on the left Hall plate positive voltage side HLP and the right Hall plate positive voltage side HRP are substantially the same and bias on input transistors 530 and 532, respectively. Also, the voltages on the left Hall plate negative voltage side HLN and the right Hall plate negative voltage side HRN are substantially the same and bias on input transistors 568 and 570, respectively. In addition, the voltages on the left Hall plate positive voltage side HLP and the right Hall plate positive voltage side HRP are substantially the same magnitude as and the negative of the voltages on the left Hall plate negative voltage side HLN and the right Hall plate negative voltage side HRN.

The current through input transistors 530 and 532 flows through first load impedance 524 and the voltage at first output OUTA is VDD minus the voltage across first load impedance 524. The current through input transistors 568 and 570 flows through second load impedance 526 and the voltage at second output OUTB is VDD minus the voltage across second load impedance 526. The voltage at first output OUTA corresponds to the voltages on the left Hall plate positive voltage side HLP and the right Hall plate positive voltage side HRP. The voltage at second output OUTA corresponds to the voltages on the left Hall plate negative voltage side HLN and the right Hall plate negative voltage side HRN. This is the test mode of operation of Hall sensor 500 in a homogeneous magnetic field.

In inverted mode and in a differential magnetic field, the voltages on the left Hall plate positive voltage side HLP and the right Hall plate negative voltage side HRN are substantially the same voltage value. Also, the voltages on the left Hall plate negative voltage side HLN and the right Hall plate positive voltage side HRP are substantially the same voltage value. In addition, the voltages on the left Hall plate positive voltage side HLP and the right Hall plate negative voltage side HRN are substantially the same magnitude as and the negative of the voltages on the left Hall plate negative voltage side HLN and the right Hall plate positive voltage side HRP.

Since, the voltages on the left Hall plate positive voltage side HLP and the right Hall plate positive voltage side HRP bias on input transistors 530 and 532, respectively, and the voltages on the left Hall plate negative voltage side HLN and the right Hall plate negative voltage side HRN bias on input transistors 568 and 570, respectively, the current through input transistors 530 and 532 is the same magnitude as the current through input transistors 568 and 570. With first load impedance 524 equal to second load impedance 526, the voltage at first output OUTA is the same as the voltage at second output OUTB, such that the difference is zero. Also, the voltage at first output OUTA corresponds to the voltages on the left Hall plate positive voltage side HLP and the right Hall plate positive voltage side HRP and the voltage at second output OUTA corresponds to the voltages on the left Hall plate negative voltage side HLN and the right Hall plate negative voltage side HRN. This is the test mode operation of Hall sensor 500 in a differential magnetic field.

The differential Hall effect sensors, such as Hall sensor 26, can be tested in a homogeneous magnetic field, instead of a differential magnetic field. The homogeneous magnetic field is easier to produce than the differential magnetic field and mechanical positioning tolerances are not as tight, which decreases measurement errors and increases product yields. Also, the Hall sensor does not have to be in close contact with the magnetic field generator, which reduces degradation of the magnetic field generator and promotes stable measurements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit, comprising:
    Hall plates configured to provide Hall voltages in a homogeneous magnetic field such that a first Hall plate has a first positive voltage and a first negative voltage and a second Hall plate has a second positive voltage and a second negative voltage; and
    an amplifier configured to receive the Hall voltages and provide a first output voltage that corresponds to the first positive voltage and the second positive voltage and a second output voltage that corresponds to the first negative voltage and the second negative voltage.

2. The circuit of claim 1, wherein the amplifier comprises:
    a first impedance;
    a second impedance;
    a first pair of differential input transistors; and
    a second pair of differential input transistors, wherein the amplifier is configured to selectively provide a first output of the first pair of differential input transistors to each of the first impedance and the second impedance.

3. The circuit of claim 2, wherein the amplifier is configured to selectively provide a second output of the first pair of differential input transistors to each of the first impedance and the second impedance.

4. The circuit of claim 2, wherein the amplifier is configured to selectively provide a second output of the second pair of differential input transistors to each of the first impedance and the second impedance.

5. The circuit of claim 4, wherein the amplifier is configured to selectively couple a first current source that is coupled to the first pair of differential input transistors and a second current source that is coupled to the second pair of differential input transistors.

6. The circuit of claim 2, wherein the first pair of differential input transistors receives the first positive voltage and the first negative voltage.

7. The circuit of claim 2, wherein the first pair of differential input transistors receives the first positive voltage and the second positive voltage.

8. The circuit of claim 1, wherein the amplifier comprises:
    a first pair of differential input transistors; and
    a second pair of differential input transistors, wherein the amplifier is configured to selectively provide the first positive voltage to each of the first pair of differential input transistors and the second pair of differential input transistors and to selectively provide the first negative voltage to each of the first pair of differential input transistors and the second pair of differential input transistors.

9. The circuit of claim 1, wherein the amplifier is configured to selectively short the Hall voltages of each of the first Hall plate and the second Hall plate.

10. A system, comprising:
    Hall plates configured to provide Hall voltages via positive voltage sides and negative voltage sides; and
    an amplifier configured to receive the Hall voltages and selectively provide a first output voltage obtained via first currents from first transistors driven by voltages on the positive voltage sides and a second output voltage obtained via second currents from second transistors driven by voltages on one of the positive voltage sides and one of the negative voltage sides.

11. The system of claim 10, wherein the amplifier is configured to provide the first output voltage with the Hall plates in a homogeneous magnetic field and the second output voltage with the Hall plates in a differential magnetic field.

12. The system of claim 10, wherein the amplifier comprises:
a first impedance;
a second impedance; and
a pair of differential input transistors, wherein the amplifier is configured to selectively provide an output of the pair of differential input transistors to each of the first impedance and the second impedance.

13. The system of claim 10, wherein the amplifier comprises:
a first pair of differential input transistors; and
a second pair of differential input transistors, wherein the amplifier is configured to selectively provide a first voltage from one of the positive voltage sides to each of the first pair of differential input transistors and the second pair of differential input transistors and to selectively provide a second voltage from one of the negative voltage sides to each of the first pair of differential input transistors and the second pair of differential input transistors.

14. The system of claim 10, wherein the amplifier is configured to selectively short the Hall voltages of each of the Hall plates.

15. A circuit, comprising:
means for providing Hall voltages via positive voltage sides and negative voltage sides;
means for receiving the Hall voltages; and
means for selectively providing a first output voltage that corresponds to voltages on the positive voltage sides and a second output voltage that corresponds to voltages on one of the positive voltage sides and one of the negative voltage sides.

16. The circuit of claim 15, wherein the means for selectively providing comprises:
means for selectively providing the first output voltage in a homogeneous magnetic field.

17. The circuit of claim 15, wherein the means for selectively providing comprises:
means for selectively providing the second output voltage in a differential magnetic field.

18. A method of testing a circuit, comprising:
providing Hall voltages in a homogeneous magnetic field, comprising:
generating a first positive voltage and a first negative voltage on a first Hall plate; and
generating a second positive voltage and a second negative voltage on a second Hall plate;
receiving the Hall voltages;
providing a first output voltage that corresponds to the first positive voltage and the second positive voltage; and
providing a second output voltage that corresponds to the first negative voltage and the second negative voltage.

19. The method of claim 18, comprising:
switching a first output of a first pair of differential input transistors from a first impedance to a second impedance.

20. The method of claim 19, comprising:
switching a second output of the first pair of differential input transistors from the second impedance to the first impedance.

21. The method of claim 19, comprising:
switching a second output of a second pair of differential input transistors from the second impedance to the first impedance.

22. The method of claim 18, comprises:
switching the first positive voltage from a first pair of differential input transistors to a second pair of differential input transistors; and
switching the first negative voltage from the second pair of differential input transistors to the first pair of differential input transistors.

23. The method of claim 18, comprising:
shorting a first Hall voltage of the first Hall plate; and
shorting a second Hall voltage of the second Hall plate.

24. A method of testing a circuit, comprising:
providing Hall voltages via positive voltage sides and negative voltage sides;
receiving the Hall voltages; and
switching an amplifier from providing a first output voltage that corresponds to voltages on one of the positive voltage sides and one of the negative voltage sides to providing a second output voltage that corresponds to voltages on the positive voltage sides.

25. The method of claim 24, comprising:
providing the second output voltage in a homogeneous magnetic field.

* * * * *